United States Patent
Soga et al.

(10) Patent No.: US 10,359,474 B2
(45) Date of Patent: Jul. 23, 2019

(54) CHARGE STATE CALCULATION DEVICE AND CHARGE STATE CALCULATION METHOD

(71) Applicant: NISSAN MOTOR CO., LTD., Yokohama-shi, Kanagawa (JP)

(72) Inventors: Tsutomu Soga, Machida (JP); Atsushi Takano, Sagamihara (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 320 days.

(21) Appl. No.: 14/426,621

(22) PCT Filed: Sep. 20, 2013

(86) PCT No.: PCT/JP2013/075448
§ 371 (c)(1),
(2) Date: Mar. 6, 2015

(87) PCT Pub. No.: WO2014/046232
PCT Pub. Date: Mar. 27, 2014

(65) Prior Publication Data
US 2015/0212161 A1    Jul. 30, 2015

(30) Foreign Application Priority Data

Sep. 21, 2012 (JP) ................... 2012-208154

(51) Int. Cl.
*G01R 31/392* (2019.01)
*G01R 31/382* (2019.01)
(Continued)

(52) U.S. Cl.
CPC ......... *G01R 31/382* (2019.01); *G01R 31/367* (2019.01); *G01R 31/3648* (2013.01);
(Continued)

(58) Field of Classification Search
CPC ........... G01R 31/3606; G01R 31/3679; G01R 35/005; G01R 31/3648; G01R 31/3651;
(Continued)

(56) References Cited

U.S. PATENT DOCUMENTS 5,561,362 A * 10/1996 Kawamura ........ G01R 31/3648
320/134
6,868,318 B1 * 3/2005 Cawthorne ........... B60L 11/005
307/10.1
(Continued)

FOREIGN PATENT DOCUMENTS

JP    2011091879 A    5/2011

*Primary Examiner* — Khamdan N. Alrobaie
(74) *Attorney, Agent, or Firm* — Young Basile Hanlon & MacFarlane, P.C.

(57) ABSTRACT

A charge state calculation device includes a detection means for detecting the voltage and/or the current of a battery, a charge state calculation means for calculating the charge state of the battery, a full charge detection means for detecting the full charge of the battery, a correction value calculation means for calculating, when the full charge of the battery is detected, a correction value for correcting the charge state to the charge state of 100%, a correction means for correcting a charge state by the correction value, and a display means for displaying the charge state thus corrected by the correction means. The correction value calculation means updates the correction value only when the full charge of the battery is detected, and maintains the updated correction value until next time the full charge of the battery will be detected.

5 Claims, 7 Drawing Sheets

(51) Int. Cl.
  *G01R 31/371* (2019.01)
  *H01M 10/44* (2006.01)
  *G01R 31/36* (2019.01)
  *G01R 35/00* (2006.01)
  *H02J 7/00* (2006.01)
  *G01R 31/367* (2019.01)
  *H02J 7/04* (2006.01)

(52) U.S. Cl.
  CPC ......... *G01R 31/371* (2019.01); *G01R 35/005* (2013.01); *H01M 10/44* (2013.01); *H02J 7/0047* (2013.01); *G01R 31/392* (2019.01); *H02J 7/045* (2013.01); *H02J 2007/0049* (2013.01)

(58) Field of Classification Search
  CPC .. G01R 31/3689; H01M 10/44; H02J 7/0047; H02J 7/0021; H02J 2007/0049; H02J 7/045
  See application file for complete search history.

(56) References Cited

U.S. PATENT DOCUMENTS

| | | | |
|---|---|---|---|
| 2003/0094321 A1* | 5/2003 | Hirata | B60L 11/1851 180/65.245 |
| 2004/0018419 A1* | 1/2004 | Sugimoto | B60L 11/1851 429/61 |
| 2011/0074433 A1* | 3/2011 | Zhang | G01R 31/3658 324/429 |
| 2011/0279094 A1* | 11/2011 | Nakatsuji | G01R 31/361 320/162 |
| 2013/0076366 A1* | 3/2013 | Arizono | G01R 31/3689 324/435 |
| 2014/0074416 A1* | 3/2014 | Park | G01R 31/3651 702/63 |

* cited by examiner

FIG. 4

| Full charge SOC predicted value (NC/QC) | | Battery temp. | | | | |
| --- | --- | --- | --- | --- | --- | --- |
| | | -25 | -10 | 5 | 20 | 35 |
| Deterioration degree | 1.0 | 60/40 | ○○/×× | ○○/×× | 95/90 | ○○/×× |
| | 0.8 | ○○/×× | | | | |
| | 0.6 | ○○/×× | | | | |
| | 0.4 | ○○/×× | | | | |
| | 0.2 | ○○/×× | ○○/×× | ○○/×× | 80/60 | ○○/×× |

CHARGE STATE CALCULATION DEVICE AND CHARGE STATE CALCULATION METHOD

CROSS REFERENCE TO RELATED APPLICATION

The present application claims priority to Japanese Patent Application No. 2012-208154, filed Sep. 21, 2012, incorporated herein in its entirety.

TECHNICAL FIELD

The present invention relates to the charge state calculation device and charge state calculation method for a battery.

BACKGROUND

A technique is known in which a battery capacity (SOC) charged from the terminal voltage at current time is specified by using a map showing the relationship between a battery capacity and a battery terminal voltage, and the battery capacity thus specified is displayed in a display unit (see, for example, Japanese Patent Application Publication No. 2011-91879 A).

However, because the previously stored relationship between the terminal voltage and the battery capacity may vary due to deterioration of the battery, when calculating the state of the battery using the map only, the error in the calculated value becomes large so that, when the battery charge state is displayed on a display unit or the like, there is a problem of giving an uncomfortable feeling to the user.

SUMMARY

The object of the present invention is to provide a charge state calculation device for calculating the SOC and a charge state calculation method so as not to give a sense of discomfort to the user when displaying the battery charge state to a display or the like.

According to the present invention, a correction value to correct a calculated charge state when the full charge of the battery is detected to the 100% of charge state, and a charge state that is corrected by the correction value will be displayed on a display unit. Further, the correction value is updated only when the full charge of the battery is detected and the updated correction value will be maintained until next time when the full charge of the battery is detected.

According to the present invention, when the error in the state of charge at full charge occurs due to deterioration etc., since the charge state is corrected to correct the error by a correction value for display the corrected charge state, i.e. the charge state after correction, on the display unit, the user may be prevented from being given with discomfort. Further, by updating the correction value only when the full charge state is detected and holding the updated correction value until next time when the full charge is detected, advantageous effects may be produced to suppress a large change in charge state after correction for display on the display unit and to prevent the user from being given with a sense of discomfort.

BRIEF DESCRIPTION OF THE DRAWINGS

FIG. 4 is a schematic diagram of a map of FIG. 4 stored in a full charge SOC prediction unit in FIG. 1;

DETAILED DESCRIPTION OF THE EMBODIMENTS

A description will now be given of an embodiment with reference to the drawings.

Figure 1:
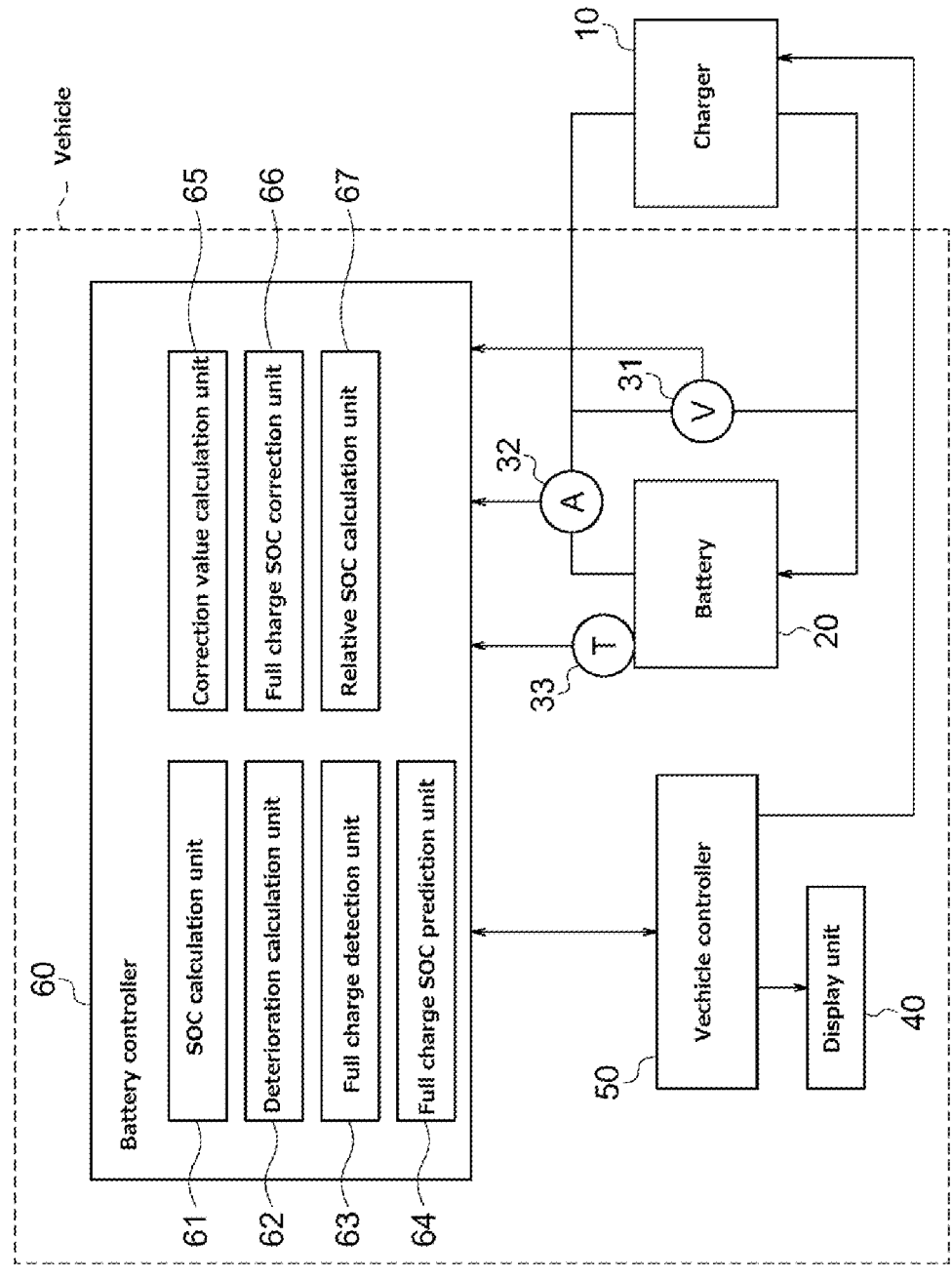
FIG. 1 is a block diagram showing a charge state calculation system in an embodiment according to the present invention.

FIG. 1 is a block diagram of a charge state calculation system in an embodiment according to the present invention. A charge state calculation device is mounted on a vehicle or the like for calculating the state of charge (SOC: State of Charge) of the battery in the vehicle and for displaying on the display unit. The charge state calculation device is included in the charge state calculation system shown in FIG. 1.

The charge state calculation system of this embodiment includes a charger 10, a battery 20, sensors 31 to 33, a display unit 40, a vehicle control controller 50, and a battery controller 60.

The charger 10 is provided for charging the battery 20 and located outside of the vehicle. The charger 10 is formed in a charging circuit which, on the basis of the control of the vehicle control controller 50, converts the power input from an AC power source (not shown) to the power suitable for charging the battery 20. The charger 10 includes an inverter, a DC/DC converter, a controller and the like. The charger 10 is connected to the battery 20 by a cable or the like.

The battery 20 is composed of a plurality of secondary batteries such as lithium ion batteries (hereinafter, also referred as cells) connected to each other, and serves as a power source of the vehicle. The battery 20 is connected to a motor (not shown) via an inverter (not shown). The battery 20 is charged by regeneration of the motor or from the charger 10 outside the vehicle.

The voltage sensor 31 is provided for detecting the terminal voltage of the battery 20, and is connected to the battery 20. The voltage sensor 31, when detecting the terminal voltage of each battery cell constituting the battery 31, is connected to the points between the plurality of respective battery terminals. The detected voltage of the voltage sensor 31 is transmitted to the battery controller 50.

The current sensor 32 is provided for detecting the current of the battery 20 and connected to the battery 20. The detected current of the current sensor 32 is transmitted to the battery controller 50.

The temperature sensor 33 is provided for detecting the temperature 20 of the and is provided in the case or the like of the battery 20. The temperature detected by the temperature sensor 33 is transmitted to the battery controller 50.

The display unit 40 is provided in the vehicle and managed by the battery controller 60 for displaying the SOC of the battery 20, the charging time of the battery 20, and the like. The display unit 40 is under control of the vehicle controller 50. Note that the display by the display unit 40 may be performed in numeric values or in the form of segment-display. However, the display mode is not limited thereto. Further, the SOC displayed on the display unit 40 is presented in the relative SOC calculated by a relative SOC calculation unit 67 to be described below.

The vehicle controller 50 is provided for controlling the entire vehicle, and controls the power receiving unit 10 and the display unit 40 and the like. Further, the vehicle controller 50, when connected between the charger 10 and battery 20 by a cable or the like, after confirming the charging type of the charger 10, controls the charger 10 to thereby charge the battery 20. During charging of the battery 20, the state of the battery 20 is managed by the battery controller 60 to be described below. The vehicle controller 50 manages the state of the battery 20 by performing signal transmission to the battery controller 60, and transmits a command power to control the charging power of the battery 20 to the charger 10, depending on the state of the battery 20. Thus, the vehicle controller 50 performs charging control of the battery 20 by controlling the charger 10.

The battery controller 60 includes a SOC calculation unit 61, a deterioration degree calculation unit 62, a full charge detecting unit 63, a full charge SOC estimation unit 64, a correction value calculation unit 65, a full charge SOC correction unit 66, and the relative SOC calculation unit 67, and is provided for controlling the battery 20. Note that, in the present embodiment, the vehicle controller 50 and the battery controller 60 are constituted separately. However, they may be constituted by a single controller.

The SOC calculation unit 61 calculates the SOC of the battery 20 from at least one of the detected values of the voltage sensor 31 and the current sensor 32.

The deterioration degree calculation unit 62 calculates the degree of deterioration of the battery 20 by calculating the internal resistance of the battery 20 based on the detected voltage of the voltage sensor 31 and the detected value of the current sensor 32. The internal resistance of the battery 20 changes due to deterioration of the battery 20. The battery controller 60 is stored in advance with the internal resistance of the battery in the initial state 20 as well as a value that indicates a battery capacity or the like at the full charge. Therefore, the deterioration degree calculation unit 62 is able to calculate the deterioration degree of the battery 20 by comparing the calculated internal resistance to the initial internal resistance.

Various methods may be used for calculating the internal resistance. For example, the internal resistance may be calculated from the open-circuit voltage of the battery 20, the detected values of the voltage sensor 31 and current sensor 32. Alternatively, it can be calculated, based on the detected values of the voltage sensor 31 and the current sensor 32, by deriving the characteristics of change in voltage with respect to that of the current of the battery 20 (hereinafter referred to as IV characteristics). Other method for calculating the deterioration degree of the battery 20 may be used than the comparison of the internal resistance. Furthermore, when calculating the degradation degree, the value of the temperature sensor 33 can be detected to be used.

The full charge detection unit 63 is a control unit that detects that the battery has reached a state of full charge by using detected a value of at least one of voltage sensor 31 and the current sensor 32.

The full charge SOC prediction unit 64 predicts the SOC in the case in which the battery 20 is detected to be in the full charge. When the full charge detection unit 63 detects the full charge of the battery 20 based on the charging current or charging voltage of the battery, the SOC of the battery 20 may be different depending on the deterioration degree of the battery 20, battery temperature or output power output from the charger 10, etc. Therefore, the full charge SOC prediction unit 64, when the battery 20 is detected to be in fully charged, assumes the SOC that has been charged in the battery 20 and predict as the full charge SOC predicted value.

The correction value calculation unit 65 calculates a correction value to correct the SOC calculated by the SOC calculation unit 61 at the time when the full charge of the battery 20 is detected by the full charge detection unit 63 to assume 100%. The SOC calculated value calculated by the SOC calculation unit 61 at the time in which the full charge detection unit 63 has detected a full charge of the battery 20 varies due to deterioration of the battery 20. Therefore, when the SOC calculated value of the SOC calculation unit 61 is displayed on the display unit 40 without modification, the SOC will not be displayed by 100% despite the detection that the battery is being fully charged. Further, the SOC displayed is subject to change due to the error of the sensors and deterioration of the battery 20. If as it is displayed on the display unit 40, the battery 20 is not applied to the detected as being fully charged, SOC is not displayed by 100%. Also, the SOC thus displayed may vary depending on errors in the associated sensors or the deterioration degree of the battery 20.

Therefore, in the present embodiment, in a state where the SOC calculated value changes, in order to display on the display unit 40 by 100% at the time in which a full charge is detected by the full charge detection unit 63, the correction value calculation unit 65 calculates the correction value.

The full charge SOC correction unit 66, by using the correction value calculated by the correction value calculation unit 65, corrects the SOC predicted value predicted by the full charge SOC prediction unit 64 to thereby calculate a corrected full charge SOC predicted value, i.e. a full charge SOC predicted value after correction.

The relative SOC calculation unit 67, by calculating a ratio of the corrected full charge SOC predicted value corrected by the full charge SOC correction unit 66, i.e. the full charge SOC predicted value after correction, to the SOC calculated value from the SOC calculation unit 61, calculates a relative SOC corresponding to a corrected value of the SOC calculated value. The relative SOC is a SOC that is intended for display on the display unit 40.

Here, description is made of the relative SOC. A battery in general exhibits the larger internal resistance as the battery temperature becomes lower so that it is difficult to charge at a charge state less than a chemically fully charged condition or state (i.e. 100% absolute SOC). Thus, based on setting the charging rate of the condition in which further charging is difficult (due to the full charge in the battery condition at that time) to 100%, a relative charging rate or the relative SOC (state-of-charge) is referred to.

By contrast, with respect to the chemically fully charged state of 100% described above, the charging rate is referred to as the absolute SOC (absolute state-of-charge). For example, when the battery temperature decreases with the internal resistance thereof increasing, at the time when the relative SOC assumes 100%, the absolute SOC at that time will be lower.

As described above, the relative SOC is defined as a charging rate that will assume 100% at the time of being fully charged at that point in time. Therefore, the relative SOC is calculated by dividing the current absolute SOC (SOC calculated value by the SOC calculation unit 61) by the absolute SOC (full charge SOC predicted value) in a fully charged condition of the battery at that time.

Note that the SOC calculated value calculated by the SOC calculation unit 61 described above, the full charge SOC predicted value calculated by the full charge SOC prediction unit 64, and the full charge SOC correction value calculated by the full-charge SOC correction unit 66 are all representative of the absolute SOC, whereas only the SOC calculated by the relative SOC calculation unit 67 represents the relative SOC. In the following, the absolute SOC is described as the absolute SOC or simply SOC, while the relative SOC will be referred to as the relative SOC.

Now, a description is given of controls of the vehicle controller 50 and the battery controller 60. First, a description is given of the charge control when charging the battery 20 to a target charging rate.

The vehicle controller 50, after confirming the connection between the charger 10 and the battery 20, by receiving a signal indicating the type of charger 10 from the charger 10, identifies the type of the charger 10. The types of charger 10 range, for example, between a normal charger (NC) and a quick charger (QC) and are distinguished by the output of the charger 10.

The vehicle controller 50 controls the battery controller 60 to check the status of the battery 20 and sets the target charging rate at the time of charging. The target charging rate is set by an operation of a user and the like. Then, the vehicle controller 50 transmits a command value suitable for charging the battery 20 to the charger 10 and starts charging.

Figure 2:
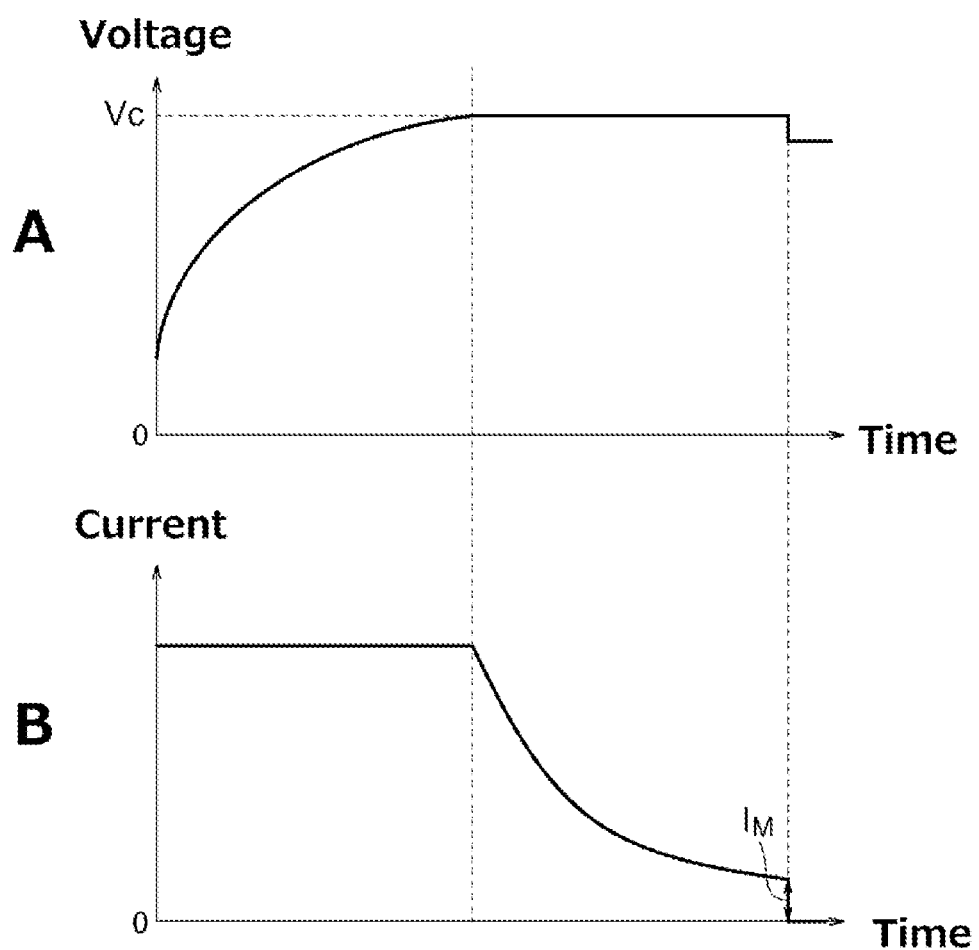
FIGS. 2A and 2B are graphs showing a voltage characteristics and a current characteristics during charging operation, respectively.

With reference to FIG. 2, a description is given of the charging control of the battery 20. FIG. 2 is a graph showing, respectively, the voltage characteristics and the current characteristics when charging the battery 20 up to full charge. The battery 10 is first charged under a constant current control, and when the voltage of the battery 10 reaches a predetermined voltage threshold (Vc), the battery is charged under a constant voltage control. A voltage threshold (Vc) shows the voltage at which the constant current control switches to the constant voltage control, and is defined in advance according to the performance of the battery 20. Note that the voltage and current characteristics shown in FIG. 10 may vary depending on the type of the battery 10.

The vehicle controller 50, at the start of charging, after confirming the SOC of the battery 20, and, when the SOC of the battery 20 is lower than the voltage threshold (Vc), transmits a command value of the constant current control to the charger 10. The charger 10 in turn, on the basis of the command value, starts charging with a constant current control.

The voltage of the battery 20 increases with elapsed time of charging. The battery controller 60 manages the voltage of the battery 20 based on the detection voltage of the voltage sensor 31. The voltage that is managed by the battery controller 60 during charging of the battery 20 is being transmitted to the vehicle controller 50. When the voltage of the battery 20 reaches the voltage threshold (Vc), the vehicle controller 50 sends a command value to the charger to transition to a constant voltage control.

In response to the command value, the charger 10 transfers from the constant current control to the constant voltage control. Thus, as the charging rate of the battery 20 increases, the voltage of the battery 20 increases and the charging current will decrease when approaching the charge voltage.

The battery controller 60 is set with a current threshold for determining the end of the charge according to the target charging rate set at the start of charging. Since the charging current during charging decreases as the charging rate of the battery is higher as described above, a lower current threshold value is set as the target charging rate is higher. During charging under the constant voltage control, the battery controller 60 manages the current of the battery 20 based on the detected current of the current sensor 32. When the current of battery 20 falls below the current threshold value set in accordance with the target charging rate, the battery controller 60 determines that the charging is completed and transmits a signal indicating thereof to the vehicle controller 50. The vehicle controller 50 in turn, based on the signal, sends a signal to terminate the charging of the battery 20 to the charger 10. The charger 10 sets the output to zero and ends the charging.

Also, when the target charging rate is set to a charging rate corresponding to the full charge of the battery 20, the battery controller 60 determines the end of the charge upon detection by the full charge detection unit 63. The full charge detection unit 63 is set with a current threshold value ($I_M$) at the time of full charge in advance, similarly to the current threshold set in accordance with the target charging rate. In addition, the full charge detection unit 63 compares the detection current of the current sensor 32 and the current threshold ($I_M$), and, when the detection current falls below the current threshold value ($I_M$), determines that the full charge has been reached. Thus, the full charge detection unit 63 detects the full charge.

During the charging control of the battery 10 described above, by integrating the detected current of the current sensor 32, the SOC calculation unit 61 calculates the SOC of the battery 20.

Figure 3:
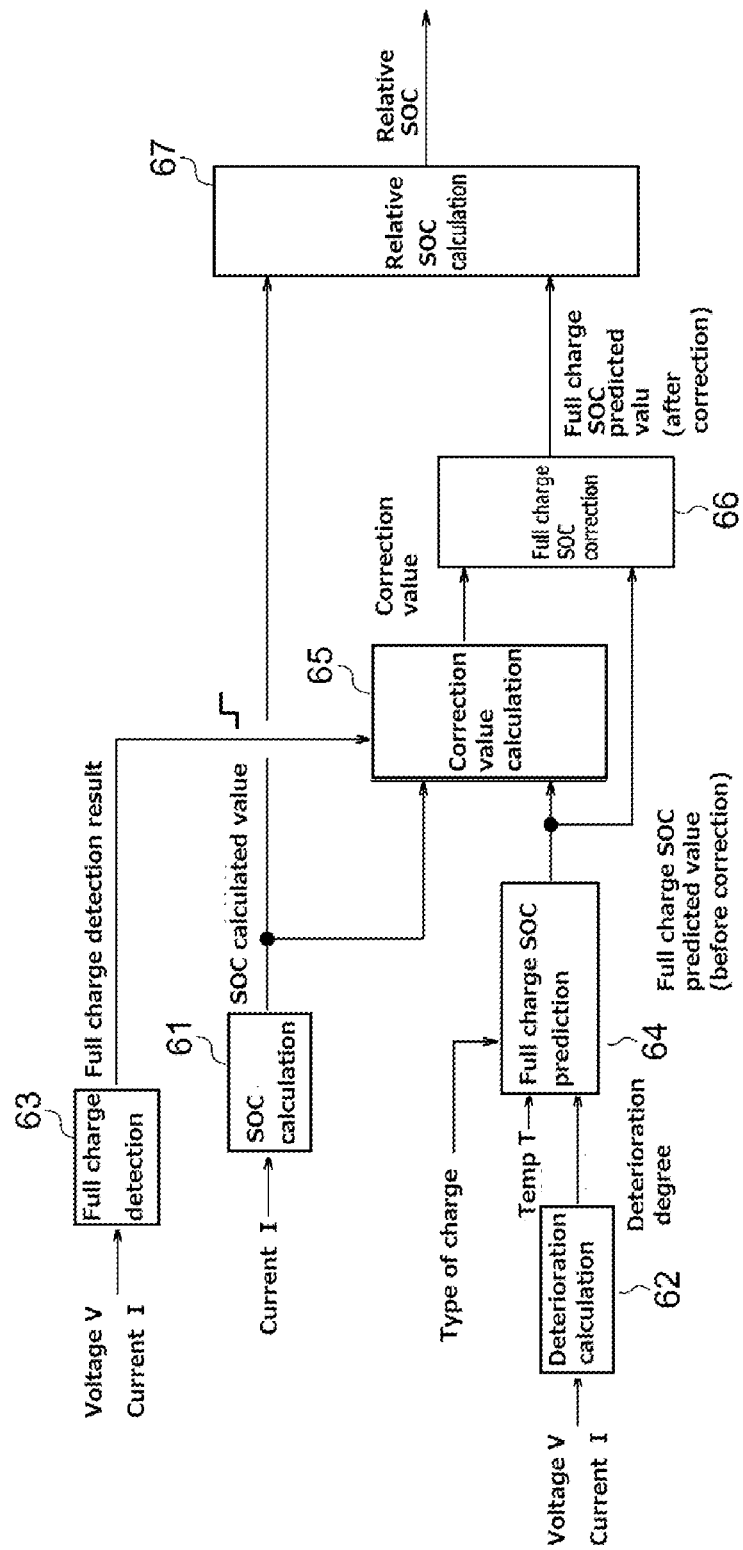
FIG. 3 is a block diagram of a battery controller.

Now, a description is given of the calculation control of the SOC of the battery 20 with reference to FIGS. 3 and 4. FIG. 3 is intended to describe the flow of SOC calculation control and shows a block diagram of a battery controller 60. FIG. 4 is a schematic diagram of a map stored in a full charge SOC prediction unit 64.

The SOC (absolute SOC) calculated by the SOC calculation unit 61 at the time of detection of full charge by the full charge state detection unit 63 varies depending on the sensor errors and the deterioration degree of the battery 20. Also, the SOC (absolute SOC) at the time of full charge varies depending upon the battery temperature and the type of the charger 10. Therefore, the relative rate of the current SOC relative to the SOC at the time of full charge, i.e. the relative SOC to be displayed on the display unit 40, which varies depending on the sensor errors, deterioration degree of the battery 20, battery temperature, type of the charger, etc. is also required to be changed in accordance with the SOC at the time of full charge. Thus, in the present embodiment, the relative SOC that is displayed on the display unit 40 is corrected in the following manner.

The full charge SOC prediction or estimation unit 64 is stored with a map shown in FIG. 4, and calculates the full charge SOC predicted value by using the map. The full charge SOC predicted value is representative of the SOC predicted value or estimate at the time in which the battery is fully charged. The full charge SOC prediction unit 64 is stored in advance with the relationship between the SOC predicted values at full charge with respect to the temperature of the battery 20, the deterioration degree of the battery 20, and charging type.

Progress of deterioration of the battery 20 varies depending on the individual batteries 20. Therefore, when the full charge is detected by the full charge detection unit 63, the SOC based on the battery capacity charged in the battery 20 actually varies depending on the individual batteries 20, either. Since the SOC reaching the fully charged state is calculated uniquely using a map, the calculation result of SOC represents only a prediction or estimated value.

Regarding the full charge SOC predicted value, the lower the battery temperature, the lower the full charge SOC predicted value. Also, the higher the deterioration degree of the battery 20 (as the deterioration progresses), the lower the full charge SOC predicted value. Further, compared to the normal charge operation, the full charge SOC predicted value at quick charge is lower.

The vehicle controller 60 determines the type of charger when the charger 10 is connected to the battery 20 and sends the determination result to the battery controller 60. The full charge SOC prediction unit 64 selects one of the quick charge map and a normal charge map based on the determination result. Subsequently, the full charge SOC prediction unit 64, by referring to the selected map, calculates the SOC predicted value as the full charge SOC predicted value, which corresponds to the deterioration degree calculated by the deterioration degree calculation unit 62 and the detection temperature of the temperature sensor 33. The full charge SOC predicted value is transmitted to the correction value calculation unit 65 and the full charge SOC correction unit 66.

Upon detecting a full charge, the full charge detection unit 63 transmits a signal indicative of attainment of full charge to the correction value calculation unit 65. The SOC calculation unit 61 transmits the calculated value to the correction value calculation unit 65 and the relative SOC calculation unit 67. When the full charge of the battery 20 is detected by the signal of the full charge detection unit 63, the correction value calculation unit 65 acquires the calculated value calculated by the SOC calculation unit 61 as the SOC calculated value at the time of full charge.

Then, based on division of the full charge SOC predicted value by the SOC calculated value at full charge, the correction value calculation unit 65 calculates a correction value. Note that the correction calculation unit 65 includes a memory (not shown) to retain the calculated correction value by overwriting the memory. In other words, each time the full charge of the battery 20 is detected, the correction value is updated in the memory by overwriting and retained until next time the full charge of the battery 20 is detected.

The correction value calculated by the correction value calculation unit 65 is a correction coefficient for correcting an error between the full charge SOC predicted value and the SOC calculated value at full charge. In response to the degradation or deterioration degree of the battery 20, if the characteristics at full charge develop similarly in the characteristics shown in the map in FIG. 4, the SOC predicted value and the SOC calculated value assume the identical value. However, in practice, due to manufacturing tolerance of the battery 20, variations in the progress of deterioration of the battery 20, detection error of the sensors, etc., an error occurs between the full charge SOC predicted value calculated using the map and the SOC calculated value at the time of full charge. Furthermore, the error is not the same each charging cycle.

Therefore, in order to correct the error described above, the correction value calculation unit 65 calculates the correction value at full-charge detection. The correction value calculation unit 65 transmits the calculated correction value to the full-charge SOC correction unit 66.

The full charge SOC correction unit 66 obtains a full charge SOC predicted value after correction, i.e. the corrected full charge SOC predicted value by multiplying the full charge SOC predicted value calculated by the full charge SOC predication unit 64 the correction value. The corrected full charge SOC predication value is obtained such that the full charge SOC predicted value calculated by the map is corrected to match the SOC calculated value at the time of full charge. In other words, the corrected full charge SOC predicted value represents a value obtained by subtracting the error between the full charge SOC predicted value and a full charge SOC calculated value before correction from the SOC predicted value at the time of full charge.

The relative SOC calculation unit 67 divides the SOC calculated value of the SOC calculation unit 61 by the corrected full charge SOC predicted value (i.e. (SOC calculated value)/(corrected full charge SOC predicted value)×100) to thereby obtain the relative SOC (%). The relative SOC is intended to be displayed on the display unit 40. Further, the user will be aware that the charging of the battery reaches full charge by confirming that the relative SOC has reached 100%.

As described above, the corrected full charge SOC predicted value is intended to obtain the actual SOC at full charge (corrected full charge SOC predicted value) in order to be displayed by 100% on the display unit by correcting the SOC that is predicted to be reached at full charge on the map (full charge SOC predicted value before correction) to match the SOC calculated value actually calculated at the time of full charge.

Here, in order to allow the user to recognize the full charge, it is preferable in the SOC display (display of relative SOC) on the display unit 40 as SOC being 100%. On the other hand, since the full charge of the battery 20 is detected by a sensor value, due to the detection error of the sensor and the like, it may be that the SOC of the battery does not reach 100%. In order to cope with this possibility, a correction value is calculated by the correction value calculation unit 65, and by calculating a corrected full charge SOC predicted value by the full charge SOC correction unit 66, respectively, the SOC display (100% indication) and the actual SOC of the full charged battery 20 (SOC calculated value actually calculated by the SOC calculation unit 61 at the time of full charge) are made to correspond to each other. Further, through an arrangement that the relative SOC is calculated by a ratio of the SOC calculated value to the actual SOC at the time of full charge, the SOC display on the display unit 40 is allowed to indicate 100% at full charge.

A description is now given of the operation control of the SOC of the battery 20 other than the time of full-charge detection. Here, a state of other than full charge detection includes, in addition to the charging period by the charger 10, a charging state by regenerative force of an electric motor (not shown) during vehicle travel, and a vehicle travelling state using the battery as propulsion source.

The SOC calculation unit 61, based on the detection value of the current sensor 32, calculates the SOC calculated value in a predetermined cycle. The relative SOC calculation unit 67, by calculating a ratio of the corrected full charge SOC predicted value calculated immediately previous detection of full charge detection to the SOC calculated value obtained by the SOC calculation unit 61, acquires the relative SOC. The relative SOC thus calculated is displayed on the display unit 40 under control of the vehicle controller 50.

Note that selection of the map by the full charge SOC prediction unit 64 is done by selecting the same map that has been selected in the previous detection of the full charge state.

Figure 5:
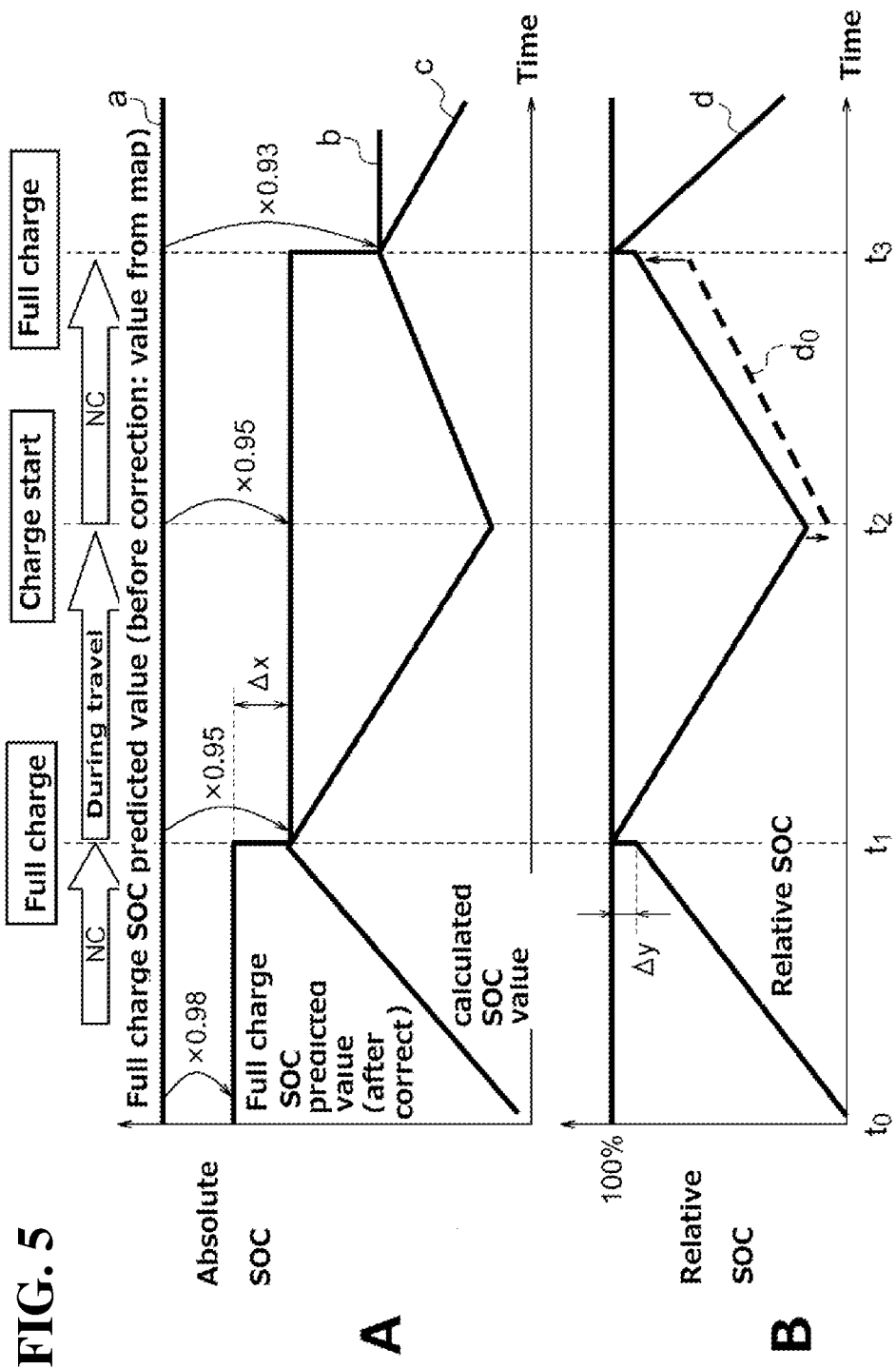
FIG. 5 is a characteristic of SOC of the battery of FIG. 1, and A is a graph showing the characteristics of the absolute SOC while B is a graph showing the characteristics of the relative SOC.

Now, with reference to FIG. 5, a description is given of the characteristics of each value, which is calculated in FIG. 3. FIG. 5 is a graph showing the SOC calculated value, the full charge SOC predicted value before correction, the corrected full charge SOC predicted value, and the relative SOC. In FIG. 5, the absolute SOC represents the SOC, which is calculated for control by the battery controller 60, and the relative SOC indicates the SOC to be displayed on the display unit 40. Note that, in the embodiment shown in FIG. 5, the battery 20 is assumed to be charged by the normal charger 10. In addition, it is also assumed that, at the stage of start charging in FIG. 5, the correction value (0.98) has been calculated. Further, for ease of explanation, the temperature and the degree of deterioration of the battery 20 are assumed to be kept constant.

At time (t0), the charger 10 of the normal charging is connected to start charging. The full charge SOC prediction unit 62 calculates the full charge SOC predicted value before correction by using the map for normal charging based on the temperature and the degree of deterioration of the battery 20. The full charge SOC predicted value before correction is a value represented on the map and assumes a constant value because the deterioration degree and the temperature of the battery 20 are set to be constant (see graph A. Then, by multiplying the correction value (0.98) to the full charge SOC predicted value before correction, and calculates the full charge SOC predicted value of the corrected full-charge Then, the full charge SOC correction unit 66, by multiplying the full charge SOC predicted value before correction with a correction value (0.98) to obtain the corrected full charge SOC predicted value (see graph B). The SOC calculated value increases along with charging of the battery 20 from Time (t0) and later.

At time (t1), since the charge current of the battery 20 reaches a current threshold (I M), the full charge detection unit 63 detects the full charge. The SOC calculated value at the time of full charge detection deviates by $\Delta x$ from the corrected full charge SOC predicted value. Further, since the full charge has been detected before the SOC calculated value reaches the corrected full charge SOC predicted value, the relative SOC deviates by $\Delta y$ from the SOC (100%).

Thus, in order to correct the error of the relative SOC ($\Delta y$) on the display unit 40 and to make the SOC display at the time of full charge detection on the display unit 40 indicating 100%, the error ($\Delta x$) will be corrected. The correction value calculation unit 65 calculates the correction value (0.95) by obtaining a ratio of the SOC calculated value and the full charge SOC predicted value before correction.

Subsequently, the full charge SOC correction unit 66, by multiplying the correction value (0.95) to the full charge SOC predicted value before correction, calculates the corrected full charge SOC predicted value. In comparison at time (t0), the correction width or magnitude is greater. At time (t1), after the correction value is updated (from 0.98 to 0.95), the full charge SOC predicted value before correction is corrected. Therefore, the error ($\Delta y$) in the relative SOC is corrected and the display on the display unit 40 is made by 100% indication.

The calculated correction value at the time of full charge is retained by storing in a memory not shown. Further, the relative SOC is obtained by a ratio of the full charge SOC prediction corrected by the retained correction value and the SOC calculation value.

On and after time (t1), the SOC calculated value decreases with the vehicle travelling. Since the corrected full time SOC predicted value is held at a constant value that is calculated at time (t1) due to the correction value being retained. The relative SOC is corrected to be 100% at time t1 and the correction value will be retained, the relative SOC begins to decrease gradually on and after t1 starting from 100%.

In time (t2), the charge is restarted by the charger 10 of normal charge type. By the charging of the battery 20, the SOC calculated value will rise and the relative SOC also increases.

Then, at time (t3), the full charge is detected, and the operation control similar to time (t1) is performed for updating the correction value.

Here, a description is given of the case in which the correction value is reset at the start of charging by the charger 10. In this case, the corrected full charge SOC predicted value reverts to the full charge SOC predicted value before correction. Further, to the extent to which the value of the denominator of the calculation formula of the relevant SOC increases, the relative SOC decreases. Thus, as shown in DO in FIG. 5, the relative SOC decreases upon start of charging to thereby lower the SOC indication on the display unit 40 in response to the start of charging, which would give the user a sense of strangeness? Further, in this case, the relative SOC at time of (t3) representing full charge is deviated from 100% by an amount corresponding to the drop in the beginning of charge. Thus, when calculating the correction value at time (t3) to correct the relative SOC to 100%, the SOC indication on the display unit 40 will change abruptly so that the user feels uneasy.

On the other hand, when the correction value is not reset at the beginning of charging and retained, the drop of the SOC indication on the display unit 40 is prevented from occurring at the beginning of charging. Further, at the time of full charge, i.e., at the time (t3), the SOC indication on the display unit 40 is prevented from deviating greatly from 100%, and the SOC indication on the display unit 40 may be prevented from abrupt change.

Figure 6:
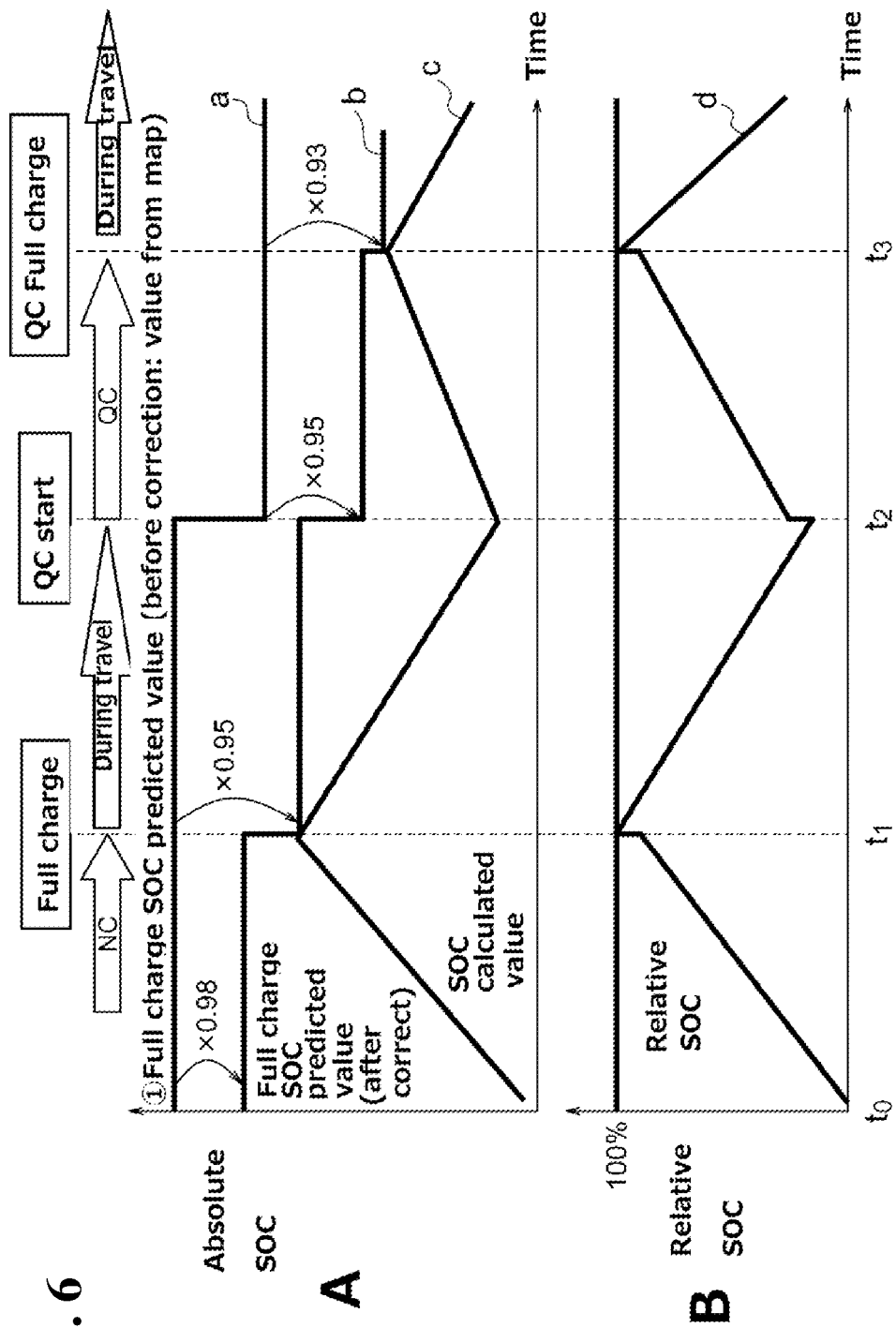
FIG. 6 is a SOC characteristics of the battery of FIG. 1, and A is a graph showing the characteristics of the absolute SOC while B is a graph showing the characteristics of the relative SOC.

Now, with reference to FIG. 6, a description is given of the characteristics of each value, which is calculated in FIG. 3. FIG. 6 is a graph showing the SOC calculated value, the full charge SOC predicted value before correction, the corrected full charge SOC predicted value, and the relative SOC. FIG. 6 shows the similar characteristics as FIG. 5 with the difference that a quick charging is done at time t2.

Since the operation control from time t1 up to immediately before t2 is similar to FIG. 5, the description thereof is omitted. At time (t 2), the charger 10 of the quick charging is connected to start charging. The full charge SOC prediction unit 62 calculates the full charge SOC predicted value before correction by using the map for quick charging based on the temperature and the degree of deterioration of the battery 20. As shown in the map in FIG. 4, the full charge SOC at the time of quick charge is lower than the full charge SOC of normal charge. Thus, at time t2, the full charge SOC predicted value before correction is lower than the value before time t2. Further, since the correction value is not updated at time t2, the corrected full charge SOC predicted value is lower as compared to the value before time t2. Note that, accompanied by the fact that the full charge SOC predicted value before correction is reduced at time t2, the relative SOC increases.

Further, on and after time (t2), the SOC calculated value rises along with the rapid charging of the battery 20, and the relative SOC increases similarly. At time (t3), full charge is detected, and the operation control similar to at time (t1) will be performed. In this case, the map of quick charging may be used.

Figure 7:
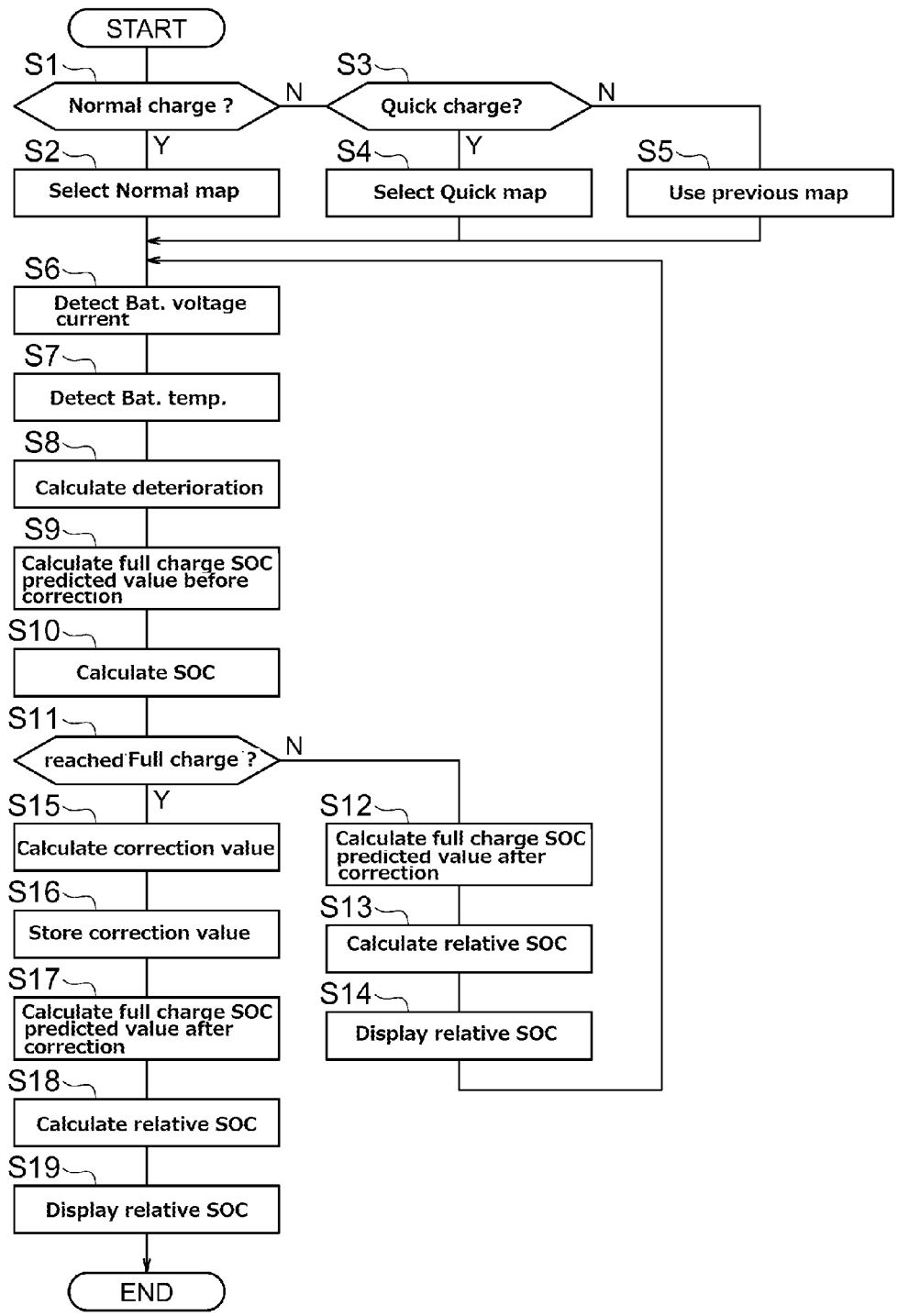
FIG. 7 is a flowchart showing a control process of the vehicle controller and the battery controller in FIG. 1.

Now, with reference to FIG. 7, a description is given of the control flow of the vehicle controller 50 and the battery controller 60. FIG. 7 is a flowchart illustrating a control process of the vehicle controller 50 and the battery controller 60. Note that the control flow is repeated during the travel of the vehicle.

In step S1, the vehicle controller 50 determines whether or not a charger for normal charge is connected. When the charger 10 for normal charge is connected, in step S2, the full charge SOC prediction unit 64 selects a map for normal charge, and the vehicle controller 50 starts charging and process proceeds to step S6.

On the other hand, when the charger 10 for normal charge is not connected, in step S3, it is determined whether or not a charger for quick charge is connected. When the charger for quick charge is connected, in step S4, the full charge SOC prediction unit 64 selects a map for quick charge, and the controller 50 starts charging with process proceeding to step S6.

When neither the charger 10 for normal charge nor the charger for quick charge is connected, in step S5, the full charge SOC prediction unit 64 selects the same map as that selected at the time of previous full charge, and process proceeds to step S6.

In step S6, the voltage sensor 31 detects the voltage of the battery 20 while the current sensor 32 detects the current of the battery 20. In step S7, the temperature sensor 33 detects the temperature of the battery 20. In step S8, the deterioration calculation unit 62 calculates the deterioration degree of the battery 20.

In step S9, the full charge SOC prediction unit 66 refers to the map selected in steps S2, S4, or S5, and calculates a full charge SOC predicted value before correction based on the deterioration degree in step S7 and the battery temperature in step S8.

In step S10, the SOC calculation unit 61 calculates the SOC of the battery 20 based on the detection value in step S6. In step S11, the full charge detection unit 63 detects whether or not the full charge has been reached by comparing the detection current detected in step S6 and the current threshold ($I_M$).

If it has not reached full charge, in step S12, the full charge SOC correction unit 66 calculates a corrected full charge SOC predicted value, i.e. a full charge SOC corrected value after correction, based on the retained correction value and the full charge SOC predicted value (before correction) calculated in step S9.

In step S13, the relative SOC calculation unit 67 calculates the relative SOC on the basis of the SOC calculated value in step S10 and the corrected full charge SOC predicted value of the step S12. Subsequently, in step S14, the vehicle controller 50 displays the calculated relative SOC on the display unit 40, and process proceeds to step S6.

Returning to step S11, when full charge is detected to be reached, in step S15, the correction value calculation unit 65 calculates a correction value based on the full charge SOC predicted value before correction in step S9 and the SOC calculated value in step S10. In step 16, the correction value calculation unit 65 stores the calculated correction value by overwriting a memory (not shown). That is, while being updated only when the system detects the full charge of the battery 20, and until the full charge of the battery 20 will be detected next time, the correction value will be stored to be retained in the memory.

In step S17, the full charge SOC correction unit 66 calculates the corrected full charge SOC predicted value, i.e., the full charge SOC predicted value after correction, based on the correction value of the step S15 and the full charge SOC predicted value calculated in step S9 (before correction).

In step S18, the relative SOC calculation unit 67 calculates the relative SOC based on the SOC calculated value in step S10 and the corrected full charge SOC predicted value in step S17. Then, in step S19, the vehicle controller 50 terminates the control in the present embodiment after displaying on the display unit 40 the calculated relative SOC (100%).

As described above, in the present embodiment, a correction value is calculated, by which the SOC calculated by the SOC calculation unit 61 is corrected to 100% of SOC—at the time in which the full charge of the battery 20 is detected. Then, a SOC calculated value is corrected by the correction value through the full charge SOC correction unit 66 and the relative SOC calculation unit 67 so that the corrected SOC, i.e. the relative SOC will be indicated on the display unit 40.Thus, by correcting the error in SOC due to sensor error, degradation of the battery 20, etc., display is given to the display unit 40 so that the user will be prevented from being given an uncomfortable feeling.

Further, in the present embodiment, the correction value is updated only when the full charge of the battery 20 is detected and the correction value is held or retained next time the full charge is detected. Thus, since the correction value is able to be calculated every charging cycle, the SOC will be calculated with high accuracy while coping with the deterioration over time. Furthermore, it is possible to suppress a change in the SOC as much as possible at the time of correction so that the change in the SOC to be displayed on the display unit 40 may be suppressed.

In addition, in the present embodiment, the correction value is obtained based on the full charge SOC predicted value and the SOC calculation unit at the time of full charge detection. Thus, it is possible to calculate accurately the correction value for correcting the error of the SOC due to deterioration of the battery 20, sensor error, etc. Consequently, when displaying the SOC on the display unit 40, the user will be prevented from given discomfort.

Moreover, in the present embodiment, a map (the map shown in FIG. 4) is prepared corresponding to the type of the charger 10 and the correction value is calculated in accordance with the type of the charger 10. Thus, when the SOC at the time of full charge is different depending on the type of the charger, the SOC at full charge may be obtained precisely. Consequently, when displaying the SOC on the display unit 40, the user may be prevented from being given discomfort.

Also, in the present embodiment, a map is provided, which indicates the correlation or correspondence between one of the deterioration degree of the battery 20 and the temperature of the battery and the full charge SOC predicted value. Thus, the correction value may be obtained accurately by considering the deterioration degree of the battery 20 and the change in temperature of the battery 20. As a result, when displaying the SOC on the display unit 40, the user may be prevented from being given discomfort.

Further, in the present embodiment, the full charge is detected based on the current of the battery 20. Thus, it is possible to improve the detection accuracy of the full charge.

Furthermore, in the present embodiment, the SOC calculated by the battery controller 60 is displayed on the display unit 40 via the vehicle controller. However, for example, by communicating between a mobile terminal held by the user and the vehicle controller 50, the SOC may be displayed on a display of the mobile terminal. Further, in the present embodiment, the SOC calculated by the battery controller 60 may be displayed via the vehicle controller 50 on the charger 10.

In addition, in order to calculate the SOC (relative SOC) to be displayed on the display unit 40, in the present embodiment, the full charge SOC predicted value is corrected by the full charge SOC correction unit 66 using the correction value of the correction value calculation unit 65. However, using that correction value, the SOC calculated value of the SOC calculation unit 61 may be corrected.

In other words, the correction unit corresponding to the full charge SOC correction unit 66 corrects the SOC calculated value using the correction value of the correction value calculation unit 65. Then, the relative SOC calculation unit 67 is calculated by obtaining a ratio of the corrected SOC calculated value to the full charge SOC predicted value (before correction) of the full charge SOC prediction unit 64.

That is, in the present embodiment, the relative SOC calculation unit 67, when using the calculation formula for calculating the relative SOC, may correct either the SOC at full charge, which corresponds to the numerator thereof, or the calculated value (SOC), which corresponds to the denominator thereof.

Thus, the correction unit including the full charge SOC correction unit 66 and the relative SOC calculation unit 67 corrects the SOC calculated value of the SOC calculation unit by the correction value of the correction value calculation unit 65 to obtain the SOC (relative SOC) for display on the display unit 40.

Note that, in the present embodiment, the full charge detection unit 63 detects the full charge through the detected current of the battery 20. However, the full charge may be detected the detected voltage of the battery 20. For example, the voltage sensor 31 detects each terminal voltage of a plurality of batteries contained in the battery 20. The full charge detection unit 63 is previously provided with a voltage threshold for detecting the full charge being attained, and the voltage threshold is set with respect to the terminal voltage of the battery cells contained in the battery 20. The full charge detection unit 63 identifies the battery cell with highest terminal voltage by comparing each of the terminal voltages detected by the voltage detection sensor 31. Finally, the full charge detection unit 63 detects attainment of full charge when the voltage of the battery cell with the highest terminal voltage has reached the voltage threshold.

Further, the full charge detection unit 63 may calculate the charged power based on the detection value of the voltage sensor 31 and that of the current sensor 32, and subsequently detects the full charge based on the charging power.

Note that, in the present embodiment, the SOC calculation unit 61 may calculate the SOC of the battery 20 from the detected voltage of the voltage sensor 31. Since there is a correlation between the SOC and the voltage of the battery 20, by storing a map indicating the correlation in the battery controller 60 and referring to the map, SOC calculation unit 61 may calculate the SOC.

Further, the map shown in FIG. 4 illustrates the full charge SOC predicted value against the battery temperature and the deterioration degree thereof. However, a map indicating the relationship between one of the battery temperature and the deterioration degree and the full charge SOC predicted value may be use as well.

The voltage sensor 31 or the current sensor described above corresponds to the "detection means" according to the present invention. The SOC calculation unit 61 corresponds to the "state of charge calculation means" according to present invention. The full charge detection unit 63 corresponds to the "full charge detection means" according to present invention. The full charge SOC prediction unit 64 corresponds to the "full charge prediction means" according to present invention. The correction calculation unit 65 corresponds to the "correction value calculation means" according to present invention. The full charge SOC correction unit 66 and the relative SOC calculation unit 67 correspond to the "correction means" according to present invention.

The invention claimed is:

1. A charge state correction method for correcting a calculated charge state and displaying the corrected charge state, comprising:
   detecting, using a voltage sensor, a voltage of a battery;
   detecting, using a current sensor, a current of the battery;
   calculating, by a battery controller, a charge state of the battery using at least one of the current of the battery or the voltage of the battery;
   detecting, by the battery controller, a full charge of the battery;
   determining, by the battery controller, a correction value to correct the charge state of the battery to a charge state of 100%, wherein the correction value is determined by:
     updating, by the battery controller, the correction value to a new correction value when the full charge of the battery is detected, and storing the new correction value as the correction value, wherein the updating the correction value comprises:
       predicting a full charge state predicted value depending on a type of a charger used to charge the battery;
       using the charge state of the battery as an SOC calculated value at full charge; and
       calculating a new value for the correction value as a ratio of the full charge state predicted value and the SOC calculated value at full charge; and
     using the stored correction value, as the correction value, when the full charge of the battery is not detected;
   obtaining a corrected full charge state predicted value by multiplying the full charge state predicted value and the correction value; and
   obtaining a relative charge state by dividing the charge state of the battery by the corrected full charge state predicted value; and
   displaying, at a display unit, the relative charge state on a display unit.

2. A charge state calculation device of a battery for correcting a calculated charge state, comprising:
   a voltage sensor for detecting a voltage of the battery;
   a current sensor for detecting a current of the battery;
   a battery controller configured to:
     calculate a charge state of the battery using at least one of the voltage and the current;
     detect, using the at least one of the voltage and the current, that the charge state of the battery indicates a full charge of the battery;
     determine a correction value to be used to correct the charge state of the battery to indicate a charge state of 100%, wherein the battery controller determines the correction value by:

when the battery controller detects the full charge of the battery:
predicting a full charge state predicted value depending on a type of a charger used to charge the battery;
using the charge state of the battery as an SOC calculated value at full charge;
calculating a new value for the correction value as a ratio of the full charge state predicted value and the SOC calculated value at full charge; and
storing the new value as the correction value; and
when the full charge of the battery is not detected, using the stored correction value as the correction value;
obtain a corrected full charge state predicted value by multiplying the full charge state predicted value and the correction value; and
obtain a relative charge state by dividing the charge state of the battery by the corrected full charge state predicted value; and
a display unit that displays the relative charge state.

3. The charge state calculation device according to claim 2, wherein the full charge state predicted value is predicted using a map that indicates a relationship between at least one of a battery deterioration value and a battery temperature value and a predicted value of the charge state at full charge.

4. The charge state calculation device according to claim 2, wherein the battery controller is further configured to detect the full charge based on the voltage, the current, or a charged power of the battery.

5. A charge state correction method for correcting a calculated charge state and displaying the corrected charge state, comprising:
detecting, using a voltage sensor, a voltage of a battery;
detecting, using a current sensor, a current of the battery;
calculating, by a battery controller, a charge state of the battery using at least one of the current of the battery or the voltage of the battery;
detecting, by the battery controller, a full charge of the battery;
determining, by the battery controller, a correction value to correct the charge state of the battery to a charge state of 100%, wherein the correction value is determined by:
updating, by the battery controller, the correction value to a new correction value when the full charge of the battery is detected, and storing the new correction value as the correction value, wherein the updating the correction value comprises:
predicting a full charge state predicted value using a map that indicates a relationship between at least one of a battery deterioration value and a battery temperature value and a predicted value of the charge state at full charge;
using the charge state of the battery as an SOC calculated value at full charge; and
calculating a new value for the correction value as a ratio of the full charge state predicted value and the SOC calculated value at full charge; and
using the stored correction value, as the correction value, when the full charge of the battery is not detected;
obtaining a corrected full charge state predicted value by multiplying the full charge state predicted value and the correction value; and
obtaining a relative charge state by dividing the charge state of the battery by the corrected full charge state predicted value; and
displaying, at a display unit, the relative charge state on a display unit.

* * * * *